United States Patent [19]

Murotani

[11] Patent Number: 5,309,399
[45] Date of Patent: May 3, 1994

[54] SEMICONDUCTOR MEMORY

[75] Inventor: Tatsunori Murotani, Tokyo, Japan

[73] Assignee: NEC Corporation, Tokyo, Japan

[21] Appl. No.: 960,870

[22] Filed: Oct. 14, 1992

[30] Foreign Application Priority Data

Oct. 25, 1991 [JP] Japan .................................. 3-279419

[51] Int. Cl.⁵ ............................................ G11C 11/34
[52] U.S. Cl. ............................... 365/189.09; 365/226;
307/296.1; 307/296.8
[58] Field of Search ............... 365/189.09, 226, 189.07;
307/296.1, 296.8, 243, 264, 268

[56] References Cited

U.S. PATENT DOCUMENTS

4,964,084 10/1990 Jung et al. .......................... 365/226
5,077,518 12/1991 Han ................................. 365/226 X
5,121,007 6/1992 Aizaki ............................. 307/264 X Primary Examiner—Eugene R. LaRoche
Assistant Examiner—Do Hyun Yoo
Attorney, Agent, or Firm—Sughrue, Mion, Zinn, Macpeak & Seas

[57] ABSTRACT

A semiconductor memory has a first internal circuit operated by an external source, a second internal circuit operated by an internal source which outputs an internal voltage lower than that of the external source and a voltage-down-converter supplying the internal source to the second internal circuit. The voltage-down-convertor includes a reference-voltage-source circuit and voltage-down-circuit. The reference-voltage-source circuit is made up of a standard-voltage-generation-circuit generating a standard voltage equal to a standard internal source voltage, a gate circuit outputting the standard voltage as the reference voltage when a control signal from outside is of a first logic level, a dividing circuit outputting voltages which are lower or higher than the standard internal source voltage and a selection circuit which selects one of the output voltages of the dividing circuit when the control signal is of a second logic level.

7 Claims, 5 Drawing Sheets

SEMICONDUCTOR MEMORY

BACKGROUND OF THE INVENTION

1. Field of the Invention

The present invention relates to a semiconductor memory which lowers a DC source voltage supplied from outside to a value equal to a reference voltage and supplies the thus lowered power source to a selected internal circuit.

2. Description of the Related Art

The capacity of semiconductor memories now doubles every three years, papers on 16 megabit DRAMs have already been read at academic societies and samples of such DRAMs are expected on the market in the near future. Although the research and production of miniaturized elements has been developed to achieve such memory capacity, the source voltage to be supplied to the memory remains unchanged at 5 volts.

The reliability of semiconductor memories sometimes becomes deteriorated, if the source voltage is supplied unchanged, even if there is a decreased characteristic of the memory such as lower voltage proofness at some portion thereof due to the increased miniaturization of the elements. Further, there is possibility of accelerated deterioration of reliability of the elements which may be caused by a temperature rise resulting from increased power consumption of the elements. As a means to solve this problem, there has recently been a movement in the industry to provide an internal voltage-down-converter to decrease an operating voltage of the internal circuit while receiving the external source voltage unchanged as is.

By decreasing the operating voltage of the internal circuit, the electric field applied to the internal circuit is weakened. Concurrently, the temperature rise of the circuit can be controlled due to a drop in power consumption, so that decreasing the operating voltage is an effective means to improve the reliability of the circuit. However, since the operating speed of the circuit decreases as the operating voltage decreases, the above method has a drawback when applied to a semiconductor memory which requires both high capacity and high operating speed of the element.

For the purpose of retaining the advantages resulting from a lower operating voltage while retaining the moderate operating speed of the overall semiconductor element, a selected portion of the internal circuit is arranged to operate with a lower voltage. Based on the above, optimum conditions have been obtained to achieve both sufficient reliability and high speed performance of the semiconductor memory.

As an example of methods applied to semiconductor memories, there is the method that a memory cell portion of the semiconductor memory is operated by a lowered voltage to protect against possible deterioration of the reliability of the portion which may be caused by thin films applied thereto to increase capacity, and other circuits of the memory are operated by the external source voltage.

Figure 1:
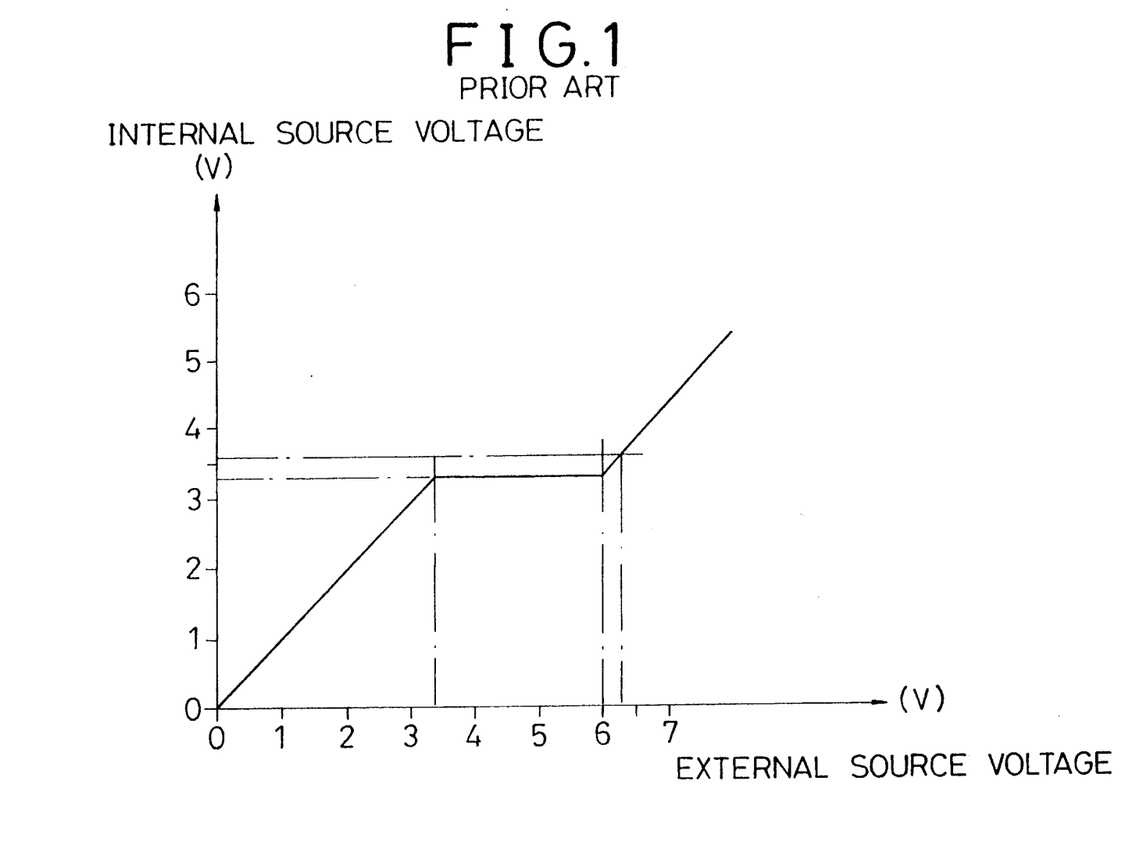
FIG. 1 is a graph showing a performance characteristic of a voltage-down-converter of a conventional semiconductor memory.

FIG. 1 is a diagram showing the operation characteristic of an example of a voltage-down-converter (not shown) devised so as to be incorporated in this type of semiconductor memory, wherein the lateral axis represents an external source voltage and the vertical axis an internal source voltage. The operation of the voltage-down-converter will be described with reference to FIG. 1. The internal source voltage which is equal to the output voltage of the voltage-down-converter keeps a predetermined voltage (a standard internal voltage) 3.3 V during a normal operation. Therefore, the internal source voltage increases as the external source voltage increases until the external source voltage reaches 3.3 V. When the external source voltage exceeds 3.3 V and increases to 6 V, the internal source voltage holds a predetermined value of 3.3 V. When the external source voltage increases over 6 V, the internal source voltage also increases in accordance with the increase of the external source voltage.

In the above voltage-down-converter, an increase of the external source voltage over 6 V results in an increase of the internal source voltage over the predetermined value to effectively perform a burn-in test in screening for removing initial defects. A burn-in test is a method for removing initial defects in a reduced time by detecting defects generated at an accelerated rate by operating the memory under a high temperature environment and by applying a higher voltage thereto. However, with the structure of the memory wherein the selected portion of the internal circuit is operated by the above voltage-down-converter, since the internal source voltage obtained through a voltage drop is applied to the portion, a voltage corresponding to a higher voltage supplied from outside by the burning test is not applied to the internal circuit, thereby resulting in failure to accelerate the detection of defects. Therefore, the memory of the present invention is arranged to have the characteristic of increasing the internal source voltage only at the time of the burn-in test when a high external source voltage is applied.

Conventional semiconductor memories incorporating a voltage-down-converter with the above characteristic have the drawback that memories with a small margin against source voltage variation are sometimes shipped without being detected by the source-voltage-margin-test which is performed by varying the external source voltage (usually 4.0 to 6.0 V) before shipment. The reason is described below.

Generally, since it is necessary to guarantee at the time of shipment of semiconductor devices including memories, that the product satisfies the characteristics listed in specifications, various tests are performed before shipment. The most important parameter which influences all of the characteristics in the above tests is the source voltage. In the case that the rated source voltage of the product is 5 V (D C), the product is normally guaranteed against various characteristics under the applied external source voltage in the range of 5.0 V + −10%. Consequently, all of the characteristics of the product are required to be satisfied for the source voltage in the range of 4.5 to 5.0 V, but the actual test is performed with a safety margin for the source voltage in the range of 4.0 to 6.0 V. However, in a semiconductor memory incorporating the above voltage-down-converter, a constant voltage lowered by the voltage-down-converter is supplied to the internal circuit even if the external source voltage is varied in the range of 4.0 to 6.0 V, so that no source margin test of the internal circuit can actually be performed. This gives the user the false impression that the product has an extraordinarily sufficient stable margin against variation of the source capacity to the great advantage of the overall characteristics of the product. However, this results in the following problem for the maker which ships the product.

In other words, even if supplied by the voltage-down-converter, voltages to be supplied to the internal circuit often vary according to variations in the external source voltage or the influence of noises. In particular, variations due to noise are unpredictable. It is difficult to test in advance. Therefore, with the conventional test method, there is the possibility of shipping products whose internal circuits have only a small margin for operation voltage, which may cause defective operation when the internal source voltage varies due to the influence of noise in actual operation.

In order to prevent this problem, even if the semiconductor memory is so structured as to supply a constant low voltage to a portion of the internal circuit of the memory from the voltage-down-converter, it is further necessary to provide the portion of the internal circuit with a sufficient operational margin against variations in the source voltage. In other words, power source voltages higher or lower than the predetermined voltages should be applied to the internal circuit which is designed to receive the predetermined voltage, and testing performed to remove products with small operational margins during pre-shipment testing as defective.

To meet the above purpose, the operational margin of the internal circuits of conventional semiconductor memories can be tested against source voltage variations, if the rising characteristic of the lower voltage and higher voltage sides of the voltage-down-converter characteristic shown in FIG. 1 are utilized.

However, in order to perform a performance test with this method, it is necessary to increase or decrease the external source voltage more than is normally required. For example, if the characteristic of the voltage-down-converter is as shown in FIG. 1, then the external source voltage must be changed in the range of 3.0 to 6.3 V to perform a test in the range of 3.0 to 3.6 V against the voltage of 3.3 V of the voltage-down-converter.

Although this test condition offers no problem for circuits which are supplied with a source voltage from the voltage-down-converter, the voltage is too high for other circuits operated by the external source voltage, so that it cannot be said to be an appropriate test condition.

SUMMARY OF THE INVENTION

The present invention is presented to solve the above problems of the conventional semiconductor memory. An object of the present invention is to provide a semiconductor memory which can control the output voltage of a voltage-down-converter from outside.

In order to achieve the above object, the semiconductor memory of the present invention comprises a first internal circuit operated by an external source (an external DC power supply), a second internal circuit operated by an internal source (an internal DC power supply) which outputs an internal voltage lower than a voltage of the external source, a voltage-down-converter having a reference-voltage-source-circuit generating a reference voltage and a voltage-down-circuit generating the internal source from the external source by reference to the reference voltage, the internal source outputting the same voltage as the reference voltage, and supplying the generated internal source to the second internal circuit.

The reference-voltage-source-circuit comprises a standard-voltage-generation-circuit generating a standard voltage equal to a standard internal voltage, a dividing circuit which divides the standard voltage and outputs a divided voltage, and a selection circuit which selects the standard voltage or the divided voltage according to control signals from outside, and outputs the thus selected voltage as the reference voltage.

Further, the semiconductor memory of the present invention comprises a first internal circuit operated by an external source, a second internal circuit operated by an internal source which outputs an internal voltage lower than the voltage of the external source, and a voltage-down-converter having a reference-voltage-source-circuit generating a reference voltage and a voltage-down-circuit generating an internal source from the external source by reference to the reference voltage, the internal source outputting the same voltage as the reference voltage, and supplying the generated internal source to the second internal circuit.

The reference-voltage-source-circuit comprises a standard-voltage-generation-circuit generating a standard voltage equal to a standard internal source voltage, a gate circuit outputting the standard voltage as the reference voltage when control signals from outside are of a first logic level, a dividing circuit outputting step voltages of a plurality of levels by dividing voltages from the external source, and a step-voltage-output-circuit which selects any one of the step voltages output from the dividing circuit according to data supplied to external terminals to output the selected voltage as the reference voltage when the control signals from outside are of a second logic level.

In one preferred embodiment of the present invention, the step-voltage-output-circuit comprises latching circuits which latch data supplied on address-input-terminals which are the external terminals when the control signals are of a second logic level, and a selection circuit which selects any one of the step voltages output from the dividing circuit according to the data latched by the latching circuits to output the selected voltage as the reference voltage.

The dividing circuit comprises a plurality of resistors connected in series, one end of which is connected to the external source, the other end of which is connected to the earth.

The selection circuit is composed of a plurality of transistors, one end of each transistor being connected to each connection point of the resistors, the other end of each transistor being connected to the output terminal for the reference voltage, and any one of the plurality of transistors being turned on by the latching circuit when the control signals from outside are of a second logic level.

DETAILED DESCRIPTION OF THE PREFERRED EMBODIMENTS

Figure 2:
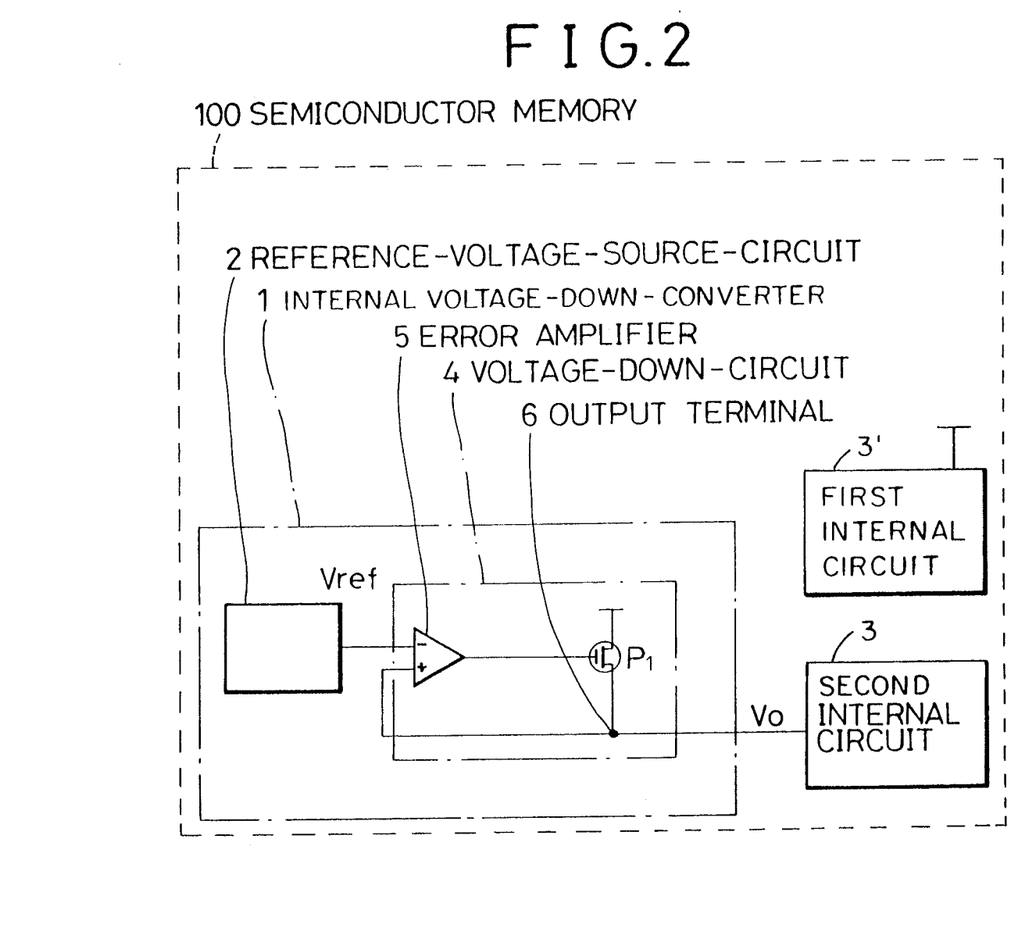
FIG. 2 is a block diagram showing an embodiment of the semiconductor memory of the present invention, wherein an internal down-converter and an internal circuit which is supplied with source power from the converter are shown.

With reference to FIG. 2, internal voltage-down-converter 1 of semiconductor memory 100 of the present invention is composed of reference-voltage-source-circuit 2 (RVS circuit 2) generating reference voltage $V_{ref}$ and voltage-down-circuit 4 which outputs voltage $V_0$ equal to reference voltage $V_{ref}$ from reference-voltage-source-circuit 2 and supplies it to internal circuit 3. Voltage-down-circuit 4 is composed of error amplifier 5 and P type MOS transistor $P_1$. The drain of transistor $P_1$ is connected to an external source and the source of transition $P_1$ is connected to output terminal 6, while a gate is connected to the output end of error amplifier 5. Reference voltage $V_{ref}$ inputted to the inversion input terminal of error amplifier 5 and output voltage $V_0$ are compared, and by controlling the gate voltage of transistor $P_1$ used for output based on the result of the comparison, output voltage $V_0$ equal to reference voltage $V_{ref}$ is supplied to internal circuit 3. Internal circuit 3 is typically a memory cell array.

Figure 3:
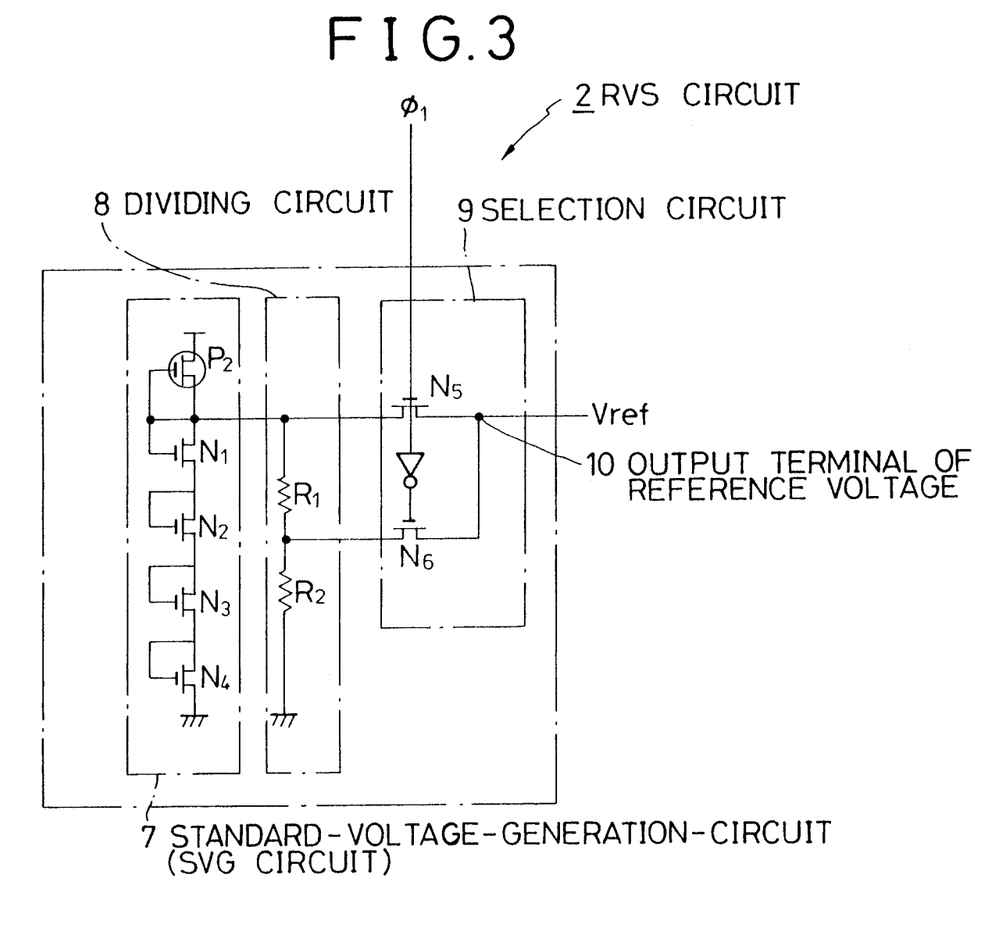
FIG. 3 is a circuit diagram showing a reference-voltage-source-circuit in FIG. 2.

As shown in FIG. 3, RVS circuit 2 comprises standard-voltage-generation-circuit 7 (SVG circuit 7) which generates a voltage equal to an internal source voltage, dividing circuit 8 divides the output voltage of SVG circuit 7 by two resistances $R_1$ and $R_2$ which are connected in series to the output terminal of SVG circuit 7.

As is apparent from FIG. 3, SVG circuit 7 is a simple circuit which utilizes threshold voltage $V_t$ of MOS transistors.

SVG circuit 7 is composed of four diode connected N type MOS transistors $N_1$, $N_2$, $N_3$ and $N_4$ connected in series and P type MOS transistor $P_2$ connected to this series circuit as a load, and SVG circuit 7 generates a voltage which is an integer multiple of threshold voltage $V_t$ of N type MOS transistors.

Selection circuit 9 consists of N type MOS transistor $N_5$ used for switching whose one electrode is connected to the output terminal of SVG circuit 7 and whose other electrode is connected to output terminal 10, and of N type MOS transistor $N_6$ used for switching, whose one electrode is connected to whose output terminal of dividing circuit 8 and whose other electrode is connected to output terminal 10. Control signal $\Phi_1$ is inputted to the gate of N type MOS transistor $N_5$ and an inversion signal of control signal $\Phi_1$ is inputted to the gate of N type MOS transistor $N_6$.

Operation of voltage-down-converter 1 shown in FIGS. 2 and 3 will now be described.

During normal operation, control signal $\Phi_1$ is held at a high level. At this time, since N type MOS transistor $N_5$ is on and N type MOS transistor $N_6$ is off, the output voltage of SVG circuit 7 is output to output terminal 10 as reference voltage $V_{ref}$ and then inputted to the inversion terminal of error amplifier 5 of internal voltage-down-circuit 4. As a result, voltage-down-converter 1 outputs a voltage equal to reference voltage $V_{ref}$ and supplies it to internal circuit 3. In other words, by keeping the output voltage of SVG circuit 7 equal to the internal source voltage for the semiconductor memory, an internal source voltage necessary for normal operation is supplied to internal circuit 3, while control signal $\Phi_1$ is kept at a low level to change the internal source voltage in the test mode.

Since at this time N type MOS transistor $N_5$ is off and N type MOS transistor $N_6$ is on, the output voltage dividing circuit 8 is output to output terminal 10. In the same way, a voltage equal to the output of dividing circuit 8 is supplied from voltage-down-converter 1 to internal circuit 3. In other words, a voltage lower than the internal source voltage in normal operation is supplied to internal circuit 3 as the source voltage.

The portion of the semiconductor memory which amplifies micro-signals from a memory cell is most liable to cause problems, and failures in circuit operation usually take place at the low source voltage side of the circuit where the quantity of memory cell signals becomes decreased. Considering the above cases, an operation test with a low source voltage is made possible in this embodiment by changing reference voltage $V_{ref}$ to a predetermined lower voltage.

Figure 4:
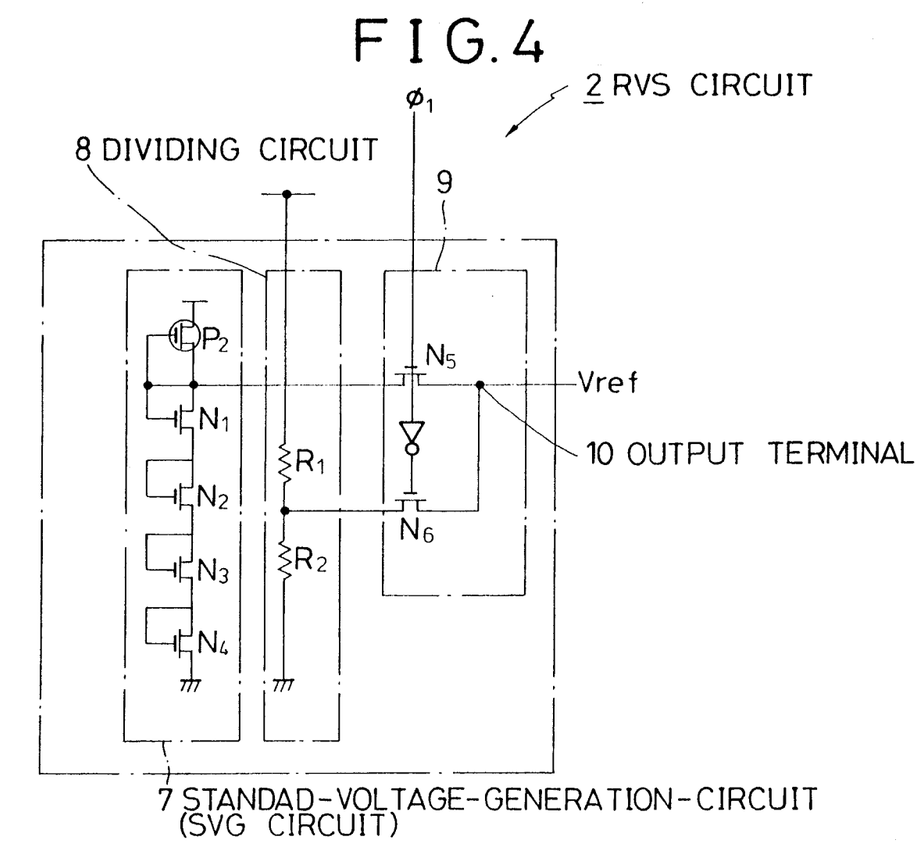
FIG. 4 is a modification of the circuit shown in FIG. 3.

The circuit shown in FIG. 3 may be modified to the circuit shown in FIG. 4. Since dividing circuit 8 is connected to the external source, dividing circuit 8 can output a voltage higher than the internal source voltage in normal operation. Depending on the ratio of resistance values between resistors $R_1$ and $R_2$, dividing circuit 8 may output a voltage lower than the internal source voltage.

There are various ways of inputting control signals $\Phi_1$, but the simplest way is to use idle pins as control signal pins.

Next, another embodiment of the present invention will be described with reference to FIG. 5. In the first embodiment shown in FIGS. 2 and 3, since only one type of voltage can be changed in the predetermined range, carefully thought out measures cannot be taken to meet user demands by changing voltages to a wider range. Further, to technically appraise product characteristics, detailed data such as the substantial margin of the internal circuit is required against source power variations. The second embodiment is structured so as to be able to select a plurality of voltages from outside to meet these requirements.

The second embodiment differs from the first embodiment shown in FIGS. 2 and 3 in that it requires a plurality of control signals from outside to select a plurality of internal source voltages. As a method for inputting control signals $\Phi_1$, a method which utilizes idle pins is shown in the first embodiment. However, since a plurality of control signals are required in the second embodiment, there may not always be a sufficient number of idle pins to meet this requirement for reasons attributable to the kind of a package which accommodates memories. Therefore, in the second embodiment, address input pins are used as the control signals.

Figure 5:
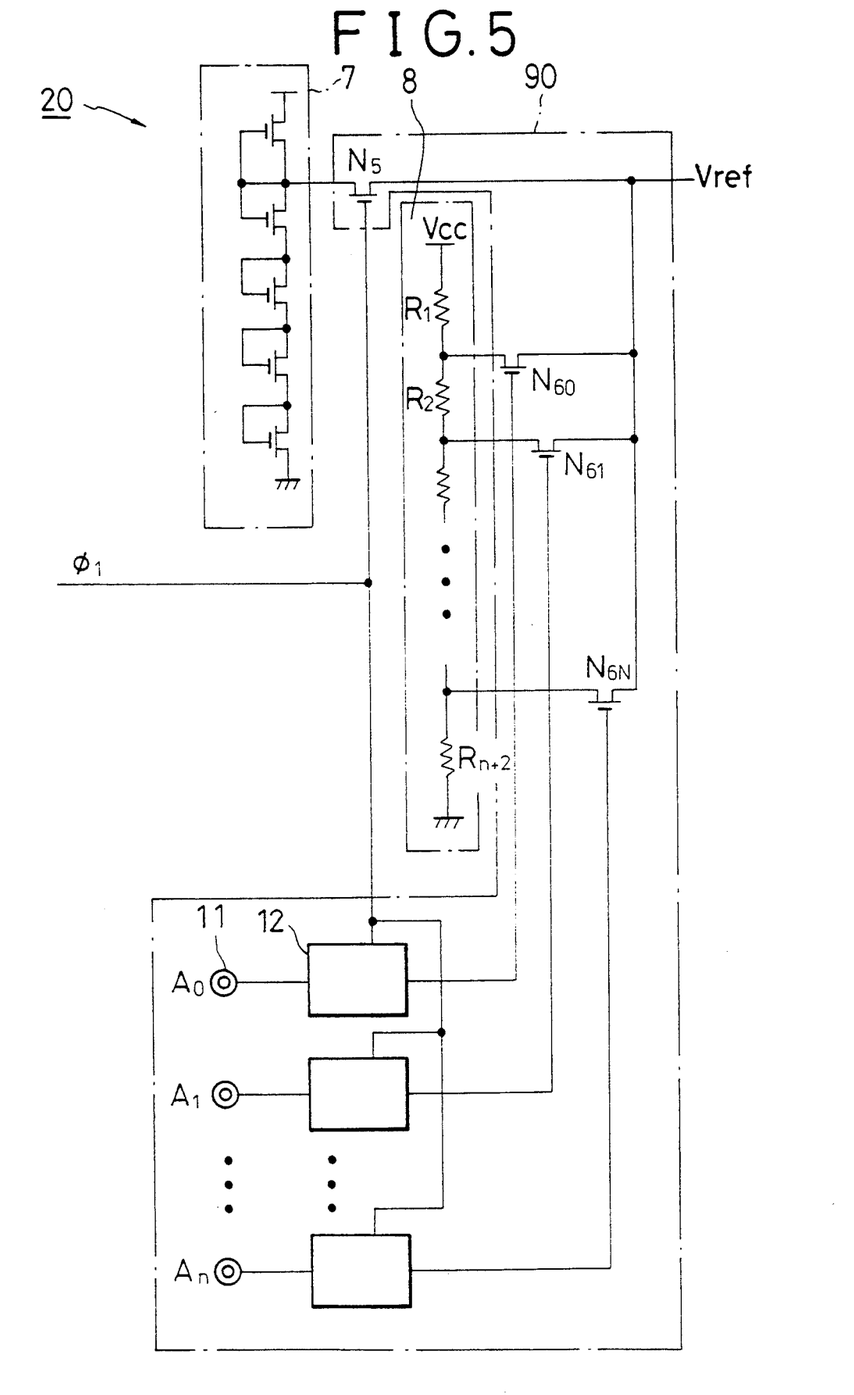
FIG. 5 is a circuit diagram showing the reference-voltage-source-circuit of another embodiment of the present invention.

The difference between reference-voltage-source-circuit 20 of the voltage-down-converter of the embodiment shown in FIG. 5 and reference-voltage-source-circuit 2 in FIG. 3 exists particularly in the structure of dividing circuit 80 and selection circuit 90. In dividing circuit 80, source voltage $V_{cc}$ supplied from outside is divided by (n+2) resistors $R_1$ to $R_{n+2}$. Between each (n+1) division point and output terminal 10, N type MOS transistors $N_{60}$ to $N_{6n}$ used for switching are each connected to make up selection circuit 90. Separately, address signals $A_0$ through $A_n$ to address-input-terminals 11 are inputted to each of latched circuits 12 which is connected to each of (n+1) address-input-terminals 11, and an output signal from each of latching circuits 12 is inputted to each gate of N type MOS transistors $N_{60}$ to $N_{6n}$ used for switching. Signal receiving operation of each latching circuit 12 is controlled by control signal $\Phi_1$, which control signal $\Phi_1$ is also inputted to a gate of N type MOS transistor $N_5$ used for switching provided between the output terminal of standard-voltage-generation-circuit 7 and output terminal 10 of the reference-voltage-source-circuit.

In the second embodiment, the desired voltage of the internal-voltage-down-source is selected as follows. Signals are inputted to address-input-terminals 11 corresponding to the desired internal source voltage at the initial state before commencing read/write operation to the memory. Since signals to address-input-terminal 11 are received by latching circuits 12 through control signal $1_1$ and stored therein, address-input-terminal 11 can be used thereafter as an original address-input-terminal. By receiving an output signal from any one of latching circuits 12, the corresponding N type MOS transistor ($N_{60}$ to $N_{6n}$) for switching is connected to output terminal 10, thereby outputting to terminal 10 the voltage of one division point of dividing circuit 80.

What is claimed is:

1. A semiconductor memory, comprising:
   a first internal circuit operated by an external source;
   a second internal circuit operated by an internal voltage-down-converter which outputs an internal voltage lower than the voltage of the external source; wherein,
   the internal voltage-down-converter has a reference-voltage-source-circuit generating a reference voltage and a voltage-down-circuit generating the internal voltage from the external source by reference to the reference voltage, the internal voltage-down-converter outputting the same voltage as the reference voltage and supplying that voltage to the second internal circuit as the internal voltage; wherein,
   the reference-voltage-source-circuit comprises a standard-voltage-generation-circuit generating a standard voltage equal to a standard internal source voltage, a dividing circuit which divides the standard voltage and outputs a divided voltage, and selection circuit which selects the standard voltage or the divided voltage according to control signals form outside and outputs the thus selected voltage as the reference voltage.

2. The semiconductor memory according to claim 1, wherein,
   the standard-voltage-generation-circuit comprises a plurality of diode-connected transistors connected in series to each other, having one end thereof connected to the external source and the other end connected to a ground;
   the dividing circuit comprises a first resistor, one end of which is connected to an output terminal of the standard-voltage-generation-circuit, and a second resistor, one end of which is connected to the other end of the first resistor while the other end of which is connected to the ground; and
   the selection circuit comprises a first transistor, one end of which is connected to the output terminal of the standard-voltage-generation-circuit, the other end of which is connected to an output terminal of the reference-voltage-source circuit, the gate of which the control signals are inputted, and a second transistor, one end of which is connected to the one end of the second transistor, the other end of which is connected to the output terminal of the reference-voltage-source circuit, the gate of which the control signals are inputted through an inverter.

3. The semiconductor memory according to claim 1, wherein,
   the standard-voltage-generation-circuit comprises a plurality of diode-connected transistors connected in series to each other, having one end thereof connected to the external source and the other end connected to a ground, said standard-voltage-generating-circuit having an output terminal;
   the dividing circuit comprises a first resistor, one end of which is connected to an external power source, and a second resistor, one end of which is connected to the other end of the first resistor while the other end is connected to the ground; and
   the selection circuit comprises a first transistor, one end of which is connected to the output terminal of the standard-voltage-generation-circuit, the other end of which is connected to an output terminal of the reference-voltage-source-circuit, the gate of which the control signals are inputted, and a second transistor, one end of which is connected to the one end of the second resistor, the other end of which is connected to the output terminal of the reference-voltage-source-circuit, the gate of which the control signals are inputted through an inverter.

4. A semiconductor memory, comprising:
   a first internal circuit operated by an external source;
   a second internal circuit operated by an internal voltage-down-converter which outputs an internal voltage lower than the voltage of the external source; wherein,
   the voltage-down-converter has a reference-voltage-source circuit generating a reference voltage and a voltage-down-circuit generating the internal voltage from the external source by reference to the reference voltage, the internal voltage-down-converter outputting the same voltage as the reference voltage and supplying that voltage to the second internal circuit as the internal voltage; wherein,
   the reference-voltage-source-circuit comprises a standard-voltage-generation-circuit generating a standard voltage equal to a standard internal source voltage, a gate circuit outputting the standard voltage as the reference voltage to an output terminal when control signals from outside are of a first logic level, a dividing circuit outputting step voltages of a plurality of levels to the output terminal by dividing voltages from the external source, and a step-voltage-output-circuit which selects any one of the step voltages output from the dividing circuit according to data supplied to external terminals to output the selected voltage as the reference voltage when the control signals from outside are of a second logic level.

5. The semiconductor memory according to claim 4, wherein the step-voltage-output-circuit comprises latching circuits which latch data supplied on address-input-terminals which are the external terminals when the control signals are of the second logic level, and a selection circuit which selects any one of the step voltages output from the dividing circuit according to the data latched by the latching circuits to output the selected voltage as the reference voltage.

6. The semiconductor memory according to claim 5, wherein the dividing circuit comprises a plurality of resistors connected in series, one end of which is connected to the external source, the other end of which is connected to a ground.

7. The semiconductor memory according to claim 6, wherein the selection circuit is composed of a plurality of transistors, one end of each transistor being connected to each connection point of the resistors, the other end of each transistor being connected to the output terminal for the reference voltage, and any one of the plurality of transistors being turned on by the latching circuit when the control signals from outside are of the second logic.

* * * * *

UNITED STATES PATENT AND TRADEMARK OFFICE
CERTIFICATE OF CORRECTION

PATENT NO. : 5,309,399
DATED : May 3, 1994
INVENTOR(S) : Murotani

It is certified that error appears in the above-identified patent and that said Letters Patent is hereby corrected as shown below:

Column 7, line 11, change "$1_1$" to --$\Phi_1$--.

Signed and Sealed this

Twenty-fifth Day of October, 1994

Attest:

BRUCE LEHMAN

Attesting Officer

Commissioner of Patents and Trademarks